(12) United States Patent
Tsai et al.

(10) Patent No.: US 7,915,605 B2
(45) Date of Patent: *Mar. 29, 2011

(54) LED PACKAGED STRUCTURE AND APPLICATIONS OF LED AS LIGHT SOURCE

(75) Inventors: Tzong-Liang Tsai, Taichung (TW); Chih-Ching Cheng, Taichung (TW)

(73) Assignee: HUGA Optotech Inc., Taichung (TW)

( * ) Notice: Subject to any disclaimer, the term of this patent is extended or adjusted under 35 U.S.C. 154(b) by 440 days.

This patent is subject to a terminal disclaimer.

(21) Appl. No.: 11/984,730

(22) Filed: Nov. 21, 2007

(65) Prior Publication Data

US 2008/0283820 A1  Nov. 20, 2008

(30) Foreign Application Priority Data

Aug. 24, 2007  (TW) .............................. 96131342 A

(51) Int. Cl.
*H01L 33/00* (2010.01)
(52) U.S. Cl. ................ 257/13; 257/14; 257/94; 257/96; 257/E33.008

(58) Field of Classification Search ................. 257/13.1, 257/13, 14, 94, 96, 103, E33.088
See application file for complete search history.

(56) References Cited

U.S. PATENT DOCUMENTS

| | | | |
|---|---|---|---|
| 6,777,871 | B2 | 8/2004 | Duggal et al. |
| 6,900,473 | B2 | 5/2005 | Yoshitake et al. |
| 7,498,607 | B2 * | 3/2009 | Tsai et al. ........................ 257/94 |
| 2004/0104672 | A1 | 6/2004 | Shiang et al. |
| 2005/0082562 | A1 | 4/2005 | Ou et al. |
| 2005/0194608 | A1 * | 9/2005 | Chen ............................. 257/100 |
| 2005/0277218 | A1 | 12/2005 | Nakajo et al. |

* cited by examiner

*Primary Examiner* — Thinh T Nguyen
(74) *Attorney, Agent, or Firm* — Jianq Chyun IP Office

(57) ABSTRACT

LED packaged structures and applications thereof are disclosed, characterized in that: an active layer in the LED or the LED packaged structure is formed on a first semiconductor conductive layer with multi-quantum wells; and a second semiconductor conductive layer is formed on the active layer; wherein a plurality of particles formed by at least one heteromaterial are scattered between the first semiconductor conductive layer and the active layer in order to form an uneven multi-quantum well.

4 Claims, 14 Drawing Sheets

1A

LED PACKAGED STRUCTURE AND APPLICATIONS OF LED AS LIGHT SOURCE

FIELD OF THE INVENTION

The invention relates to a LED (Light-Emitting Diode) packaged structure and applications thereof, and particularly to a LED of the LED packaged structure having enhanced emission efficiency in multi-quantum wells thereof.

BACKGROUND OF THE INVENTION

Because lights of the LEDs are emitted from an active layer therein and head toward all directions, the emission efficiency of LEDs can be represented in the following formula:

$$E_{\mathit{eff}} = Ei(\text{internal}) * Ee(\text{external})$$

Wherein Ei is the emission efficiency of the internal active layer; Ee is the emission efficiency of the externally emitted lights, while $E_{\mathit{eff}}$ is the overall emission efficiency.

The attempts of improving emission efficiency of LEDs in prior arts have been mostly concentrated on improving the emission efficiency of the externally emitted lights, as can be observed in U.S. Patents US20050082562A1, US20050277218A1, US20040104672, U.S. Pat. No. 6,900,473, and US67777871. All of which are focused on improving emission efficiency of LEDs by modifying the surface of LEDs, so that irregular surfaces may be formed externally on the LEDs (via the method of etching, for example), thus preventing lights of the LEDs from total internal reflection and enhancing the emission efficiency of the externally emitted lights Ee. However, the level of Ee has reached approximately 80% under the currently available technologies, and is already straining close to physical limitations.

SUMMARY OF THE INVENTION

In light of the problems mentioned above, the emission efficiency of the externally emitted lights Ee has already reached approximately 80% but close to physical limitations. In contrast, the emission efficiency of the internal active layer Ei is only around 40%. However, it may be observed from the aforesaid formula that the overall emission efficiency $E_{\mathit{eff}}$ can also be elevated by enhancing the emission efficiency of the internal active layer Ei. Therefore, the applicant of this disclosure has previously filed for a TW patent application No. 96104691, in which an active layer of a LED has been formed with a plurality of uneven multi-quantum wells. The overall surface area of the uneven multi-quantum wells is greater than that of the conventional even multi-quantum wells, thus the emission efficiency of the internal active layer Ei may be increased, thereby enhancing the overall emission efficiency $E_{\mathit{eff}}$. As a result, packaged structures and products in which a plurality of the aforesaid uneven multi-quantum wells are used have comparatively higher intensity of light, consequently allowing the packaged structures and the products to be used more effectively.

Therefore, a primary objective of the invention is to propose a LED packaged structure, wherein the used LED has higher emission efficiency, so that the packaged structure is imparted with more efficient shapes and uses.

Another objective of the invention is to propose a backlight module using LEDs as a light source, wherein the used LEDs has higher emission efficiency so as to make the backlight module more efficient to use.

Another objective of the invention is to propose a display using LEDs as a light source, wherein the used LEDs has higher emission efficiency so as to make the display more efficient to use.

Still another objective of the invention is to propose a portable computer using LEDs as a light source for a display thereof, wherein the used LEDs has higher emission efficiency so as to make the display more efficient to use.

Still another objective of the invention is to propose a projecting apparatus using LEDs as a light source, wherein the used LEDs has higher emission efficiency so as to make the projecting apparatus more efficient to use.

Yet another objective of the invention is to propose a rear projecting TV using LEDs as a light source, wherein the used LEDs has higher emission efficiency so as to make the rear projecting TV more efficient to use.

Yet another objective of the invention is to propose a digital electronic device using LEDs as a light source, wherein the used LEDs has higher emission efficiency so as to make the digital electronic device more efficient to use.

A further objective of the invention is to propose an optic communication system using LEDs as a light source, wherein the used LEDs has higher emission efficiency so as to make the optic communication system more efficient to use.

A further objective of the invention is to propose a light bulb using LEDs as a light source, wherein the used LEDs has higher emission efficiency so as to make the light bulb more efficient to use.

A further objective of the invention is to propose a vehicular light using LEDs as a light source, wherein the used LEDs has higher emission efficiency so as to make the vehicular light more efficient to use.

A further objective of the invention is to propose a traffic signal lamp using LEDs as a light source, wherein the used LEDs has higher emission efficiency so as to make the traffic signal lamp more efficient to use.

A further objective of the invention is to propose a lane indicating lamp using LEDs as a light source, wherein the used LEDs has higher emission efficiency so as to make the lane indicating lamp more efficient to use.

A further objective of the invention is to propose a traffic indicating apparatus using LEDs as a light source, wherein the used LEDs has higher emission efficiency so as to make the traffic indicating apparatus more efficient to use.

BRIEF DESCRIPTION OF DRAWINGS

The structure and the technical means adopted by the present invention to achieve the above and other objectives can be best understood by referring to the following detailed description of the preferred embodiments and the accompanying diagrams, wherein.

DETAILED DESCRIPTION OF PREFERRED EMBODIMENTS

A LED packaged structure and applications thereof are disclosed in the invention, wherein the employed principles concerning LEDs may be easily comprehended by those of ordinary skill in the relevant prior arts, and thus will not be further described hereafter. Meanwhile, it should be noted that the drawings referred to in the following paragraphs only serve the purpose of illustrating structures related to the characteristics of the disclosure, and are not necessarily drawn according to sizes of the actual objects of the disclosure.

Figure 1A:
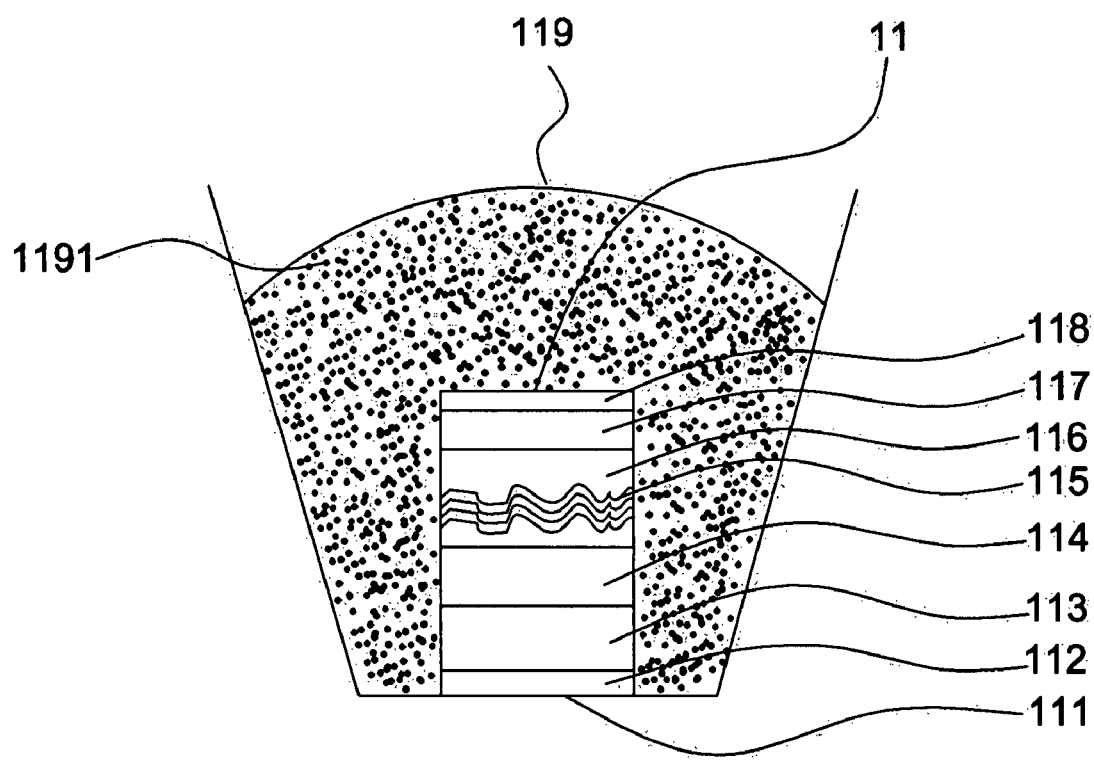
FIG. 1A is a dissected view that shows a LED packaged structure according to a first and a second preferred embodiments of the invention.

Referring to FIG. 1A, which is a dissected view that shows a blue-light LED packaged structure 1A according to a first preferred embodiment of the invention. The blue-light LED packaged structure 1A comprises a frame 111, at least a blue-light LED 11 disposed on the frame 111, and a packaging resin 119 enclosed around the blue-light LED 11. If a plurality of blue-light LEDs were present, the LEDs might be arranged in a variety of matrices in order to enhance intensity and evenness of light thereof.

The aforesaid blue-light LED 11 includes a first electrode 112, a substrate 113, a first semiconductor conductive layer 114, an active layer 115, a second semiconductor conductive layer 116, a transparent conductive layer 117, and a second electrode 118.

The substrate 113 is formed over the first electrode 112, and may be sapphires, GaN, AlN, SiC, GaAs, GaP, Si, Ge, ZnO, MgO, LAO, LGO, glass materials or the like.

The first semiconductor conductive layer 114 is formed over the substrate 113, which is a N-type semiconductor made of III-V semiconductor compounds; wherein the group III elements may be Al, Ga, or In, and the group V elements may be N, P, or As.

The active layer 115 comprises a plurality of uneven multi-quantum wells, and is formed over the first semiconductor conductive layer 114.

The second semiconductor conductive layer 116 is formed over the active layer 115, which is a P-type semiconductor made of III-V semiconductor compounds; wherein the group III elements may be Al, Ga, or In, and the group V elements may be N, P, or As.

The transparent conductive layer 117 is formed over the second semiconductor conductive layer 116, and may be Ni/Au, NiO/Au, Ta/Au, WTiN (Tungsten Titanium Nitrate), TiN (Titanium Nitrate), ITO (Indium Tin Oxide), CTO (Chrome Tin Oxide), ATO (Antimony Tin Oxide), AZO (Aluminum Zinc Oxide), or ZTO (Zinc Tin Oxide).

The second electrode 118 is formed over the transparent conductive layer 117.

It should be noted that the active layer 115 that comprises a plurality of uneven multi-quantum wells is resulted from randomly scattering a plurality of particles formed by several hetero-materials on the first semiconductor conductive layer 114, so as to allow the plurality of uneven multi-quantum wells of the active layer 115 to grow. Therefore, there is at least a hetero-material present (not shown in the drawings) between the first semiconductor conductive layer 114 and the active layer 115 that comprises a plurality of uneven multi-quantum wells in this invention. The aforesaid plurality of particles formed by hetero-materials such as group II elements, group III elements, group V elements, group VI elements, group III-V compounds, group II-V compounds, or group II-VI compounds; as long as the selected hetero-material is different from the one used in the first semiconductor conductive layer 114.

In the aforesaid embodiment, the multi-quantum wells of the active layer 115 may comprise nitrides, phosphides, arsenide compounds, or phosphide-arsenide compounds; the used materials belong to the III-V semiconductor compounds, wherein the group III elements may be Al, Ga, or In, and the group V elements may be N, P, or As. For the multi-quantum wells of the active layer 115, a width/height ratio derived from cross-sections of the uneven multi-quantum wells approximately ranges between 3:1 to 1:10, and a surface roughness thereof (Ra) ranges between 0.5-50 nm, wherein the value of Ra is preferably between 30-40 nm.

A second preferred embodiment is further disclosed in the invention, which is related to a white-light LED packaged structure. Still referring to FIG. 1A, the white-light LED packaged structure is characterized in that: the packaging resin 119 includes therein a plurality of wave-length converting scatters 1191, such as yellow phosphor; and blue light emitted from the blue-light LED 11 to the phosphor is scattered by the phosphor, wherein a portion of the blue light is absorbed by the yellow phosphor and subsequently emitted as yellow light. Consequently, the blue light and the yellow light are mixed together, thus giving rise to white light for emission.

Figure 1B:
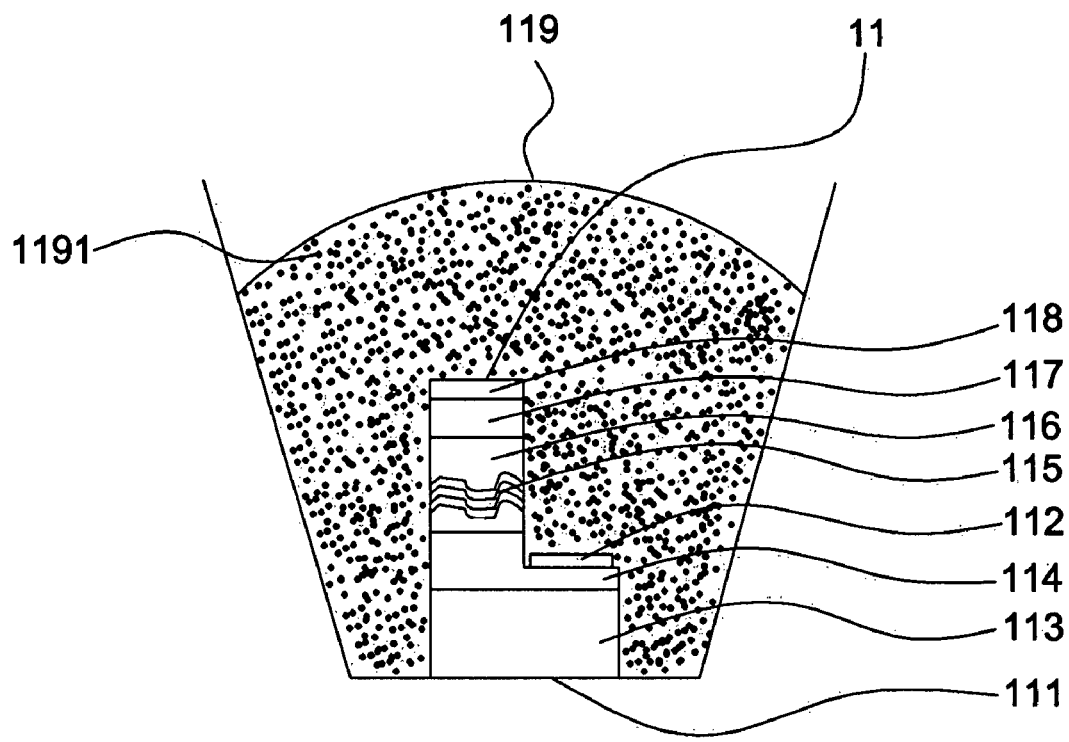
FIG. 1B is a dissected view that shows a LED packaged structure according to a third and a fourth preferred embodiments of the invention.

FIG. 1B is a dissected view that shows a blue-light LED packaged structure 1B according to a third preferred embodiment of the invention. The blue-light LED packaged structure 1B includes a frame 111, at least a blue-light LED 11 disposed on the frame 111, and a packaging resin 119 enclosed around the blue-light LED 11. If a plurality of blue-light LEDs were present, the LEDs might be arranged in a variety of matrices so as to enhance intensity and evenness of light thereof.

The aforesaid blue-light LED 11 includes a substrate 113, a first semiconductor conductive layer 114, a first electrode 112, an active layer 115, a second semiconductor conductive layer 116, a transparent conductive layer 117, and a second electrode 118.

The substrate 113 may be sapphires, GaN, AlN, SiC, GaAs, GaP, Si, Ge, ZnO, MgO, LAO, LGO, glass materials or the like.

The first semiconductor conductive layer 114 is formed over the substrate 113, which is a N-type semiconductor made of III-V semiconductor compounds; wherein the group III elements may be Al, Ga, or In, and the group V elements may be N, P, or As.

The first electrode 112 is formed over the first semiconductor conductive layer 114 and exposed externally.

The active layer 115 is formed over the first semiconductor conductive layer 114 and has a plurality of uneven multi-quantum wells.

The second semiconductor conductive layer 116 is formed over the active layer 115, and is a P-type semiconductor made of III-V semiconductor compounds; wherein the group III elements may be Al, Ga, or In, and the group V elements may be N, P, or As.

The transparent conductive layer 117 is formed over the second semiconductor conductive layer 116, and may be Ni/Au, NiO/Au, Ta/Au, WTiN, TiN, ITO, CTO, ATO, AZO, or ZTO.

The second electrode 118 is formed over the transparent conductive layer 117.

It should be noted that the active layer 115 that comprises a plurality of uneven multi-quantum wells is resulted from randomly scattering a plurality of particles formed by several hetero-materials on the first semiconductor conductive layer 114, so as to allow the plurality of uneven multi-quantum wells of the active layer 115 to grow. Therefore, there is at least a hetero-material present (not shown in the drawings) between the first semiconductor conductive layer 114 and the active layer 115 that comprises a plurality of uneven multi-quantum wells in this invention. The aforesaid plurality of particles formed by hetero-materials may be group II elements, group III elements, group V elements, group VI elements, group III-V compounds, group II-V compounds, and group II-VI compounds; as long as the selected hetero-material is different from the one used in the first semiconductor conductive layer 114.

In the aforesaid embodiment, the multi-quantum wells of the active layer 115 may comprise nitrides, phosphides, arsenide compounds, or phosphide-arsenide compounds; the used materials belong to the III-V semiconductor compounds, wherein the group III elements may be Al, Ga, or In, while the group V elements may be N, P, or As. For the multi-quantum wells of the active layer 115, a width/height ratio derived from cross-sections of the uneven multi-quantum wells approximately ranges between 3:1 to 1:10, and as approximately surface roughness thereof (Ra) ranges between 0.5-50 nm, wherein the value of Ra is preferably between 30-40 nm.

A fourth preferred embodiment is further disclosed in the invention, which is related to a white-light LED packaged structure. Still referring to FIG. 1B, the white-light LED packaged structure is characterized in that: the packaging resin 119 includes therein a plurality of wave-length converting scatters 1191, such as yellow phosphor; and blue light emitted from the blue-light LED 11 to the phosphor is scattered by the phosphor, wherein a portion of the blue light is absorbed by the yellow phosphor and subsequently emitted as yellow light. Consequently, the blue light and the yellow light are mixed together, thus giving rise to white light for emission.

Figure 2:
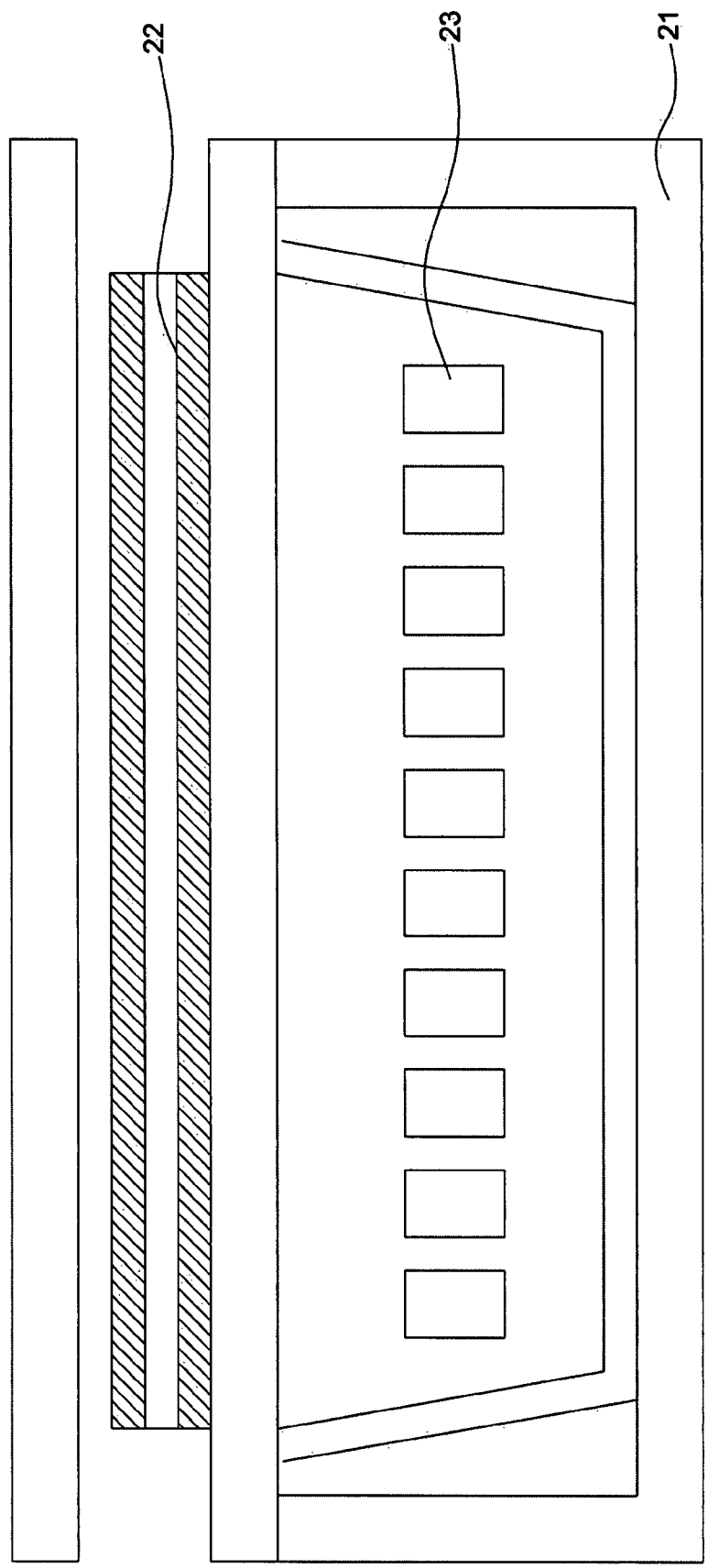
FIG. 2 is a schematic view that shows a direct light backlight module having LEDs according to a fifth preferred embodiment of the invention.
Figure 3:
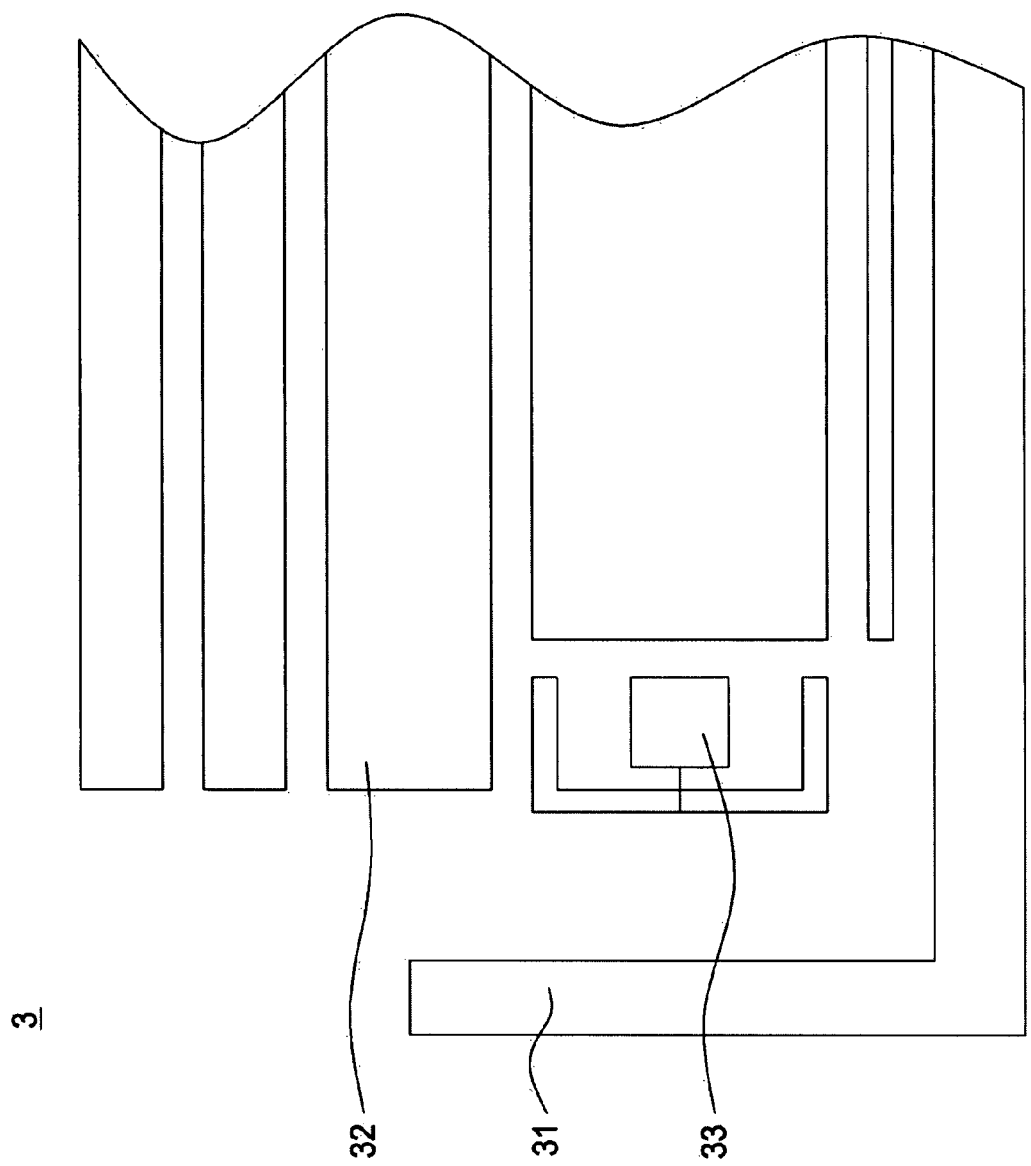
FIG. 3 is a schematic view that shows a lateral type backlight module having LEDs according to a fifth preferred embodiment of the invention.

Referring to FIGS. 2 and 3, which show an application of a backlight module in the LED or the LED packaged structure according to a fifth preferred embodiment of the invention. The backlight module may be a direct light backlight module 2 (as shown in FIG. 2), or a lateral type backlight module 3 (as shown in FIG. 3), and at least comprises a housing 21 having an opening, optic diffusing films 22 disposed adjacent to the opening, and light sources 23 disposed in the housing 21; each of the light sources 23 comprises a plurality of LED components or LED packaged structures, and the LED components or LED packaged structures employed in this case have characteristics as described in any of the first to the fourth preferred embodiments mentioned above.

Figure 4:
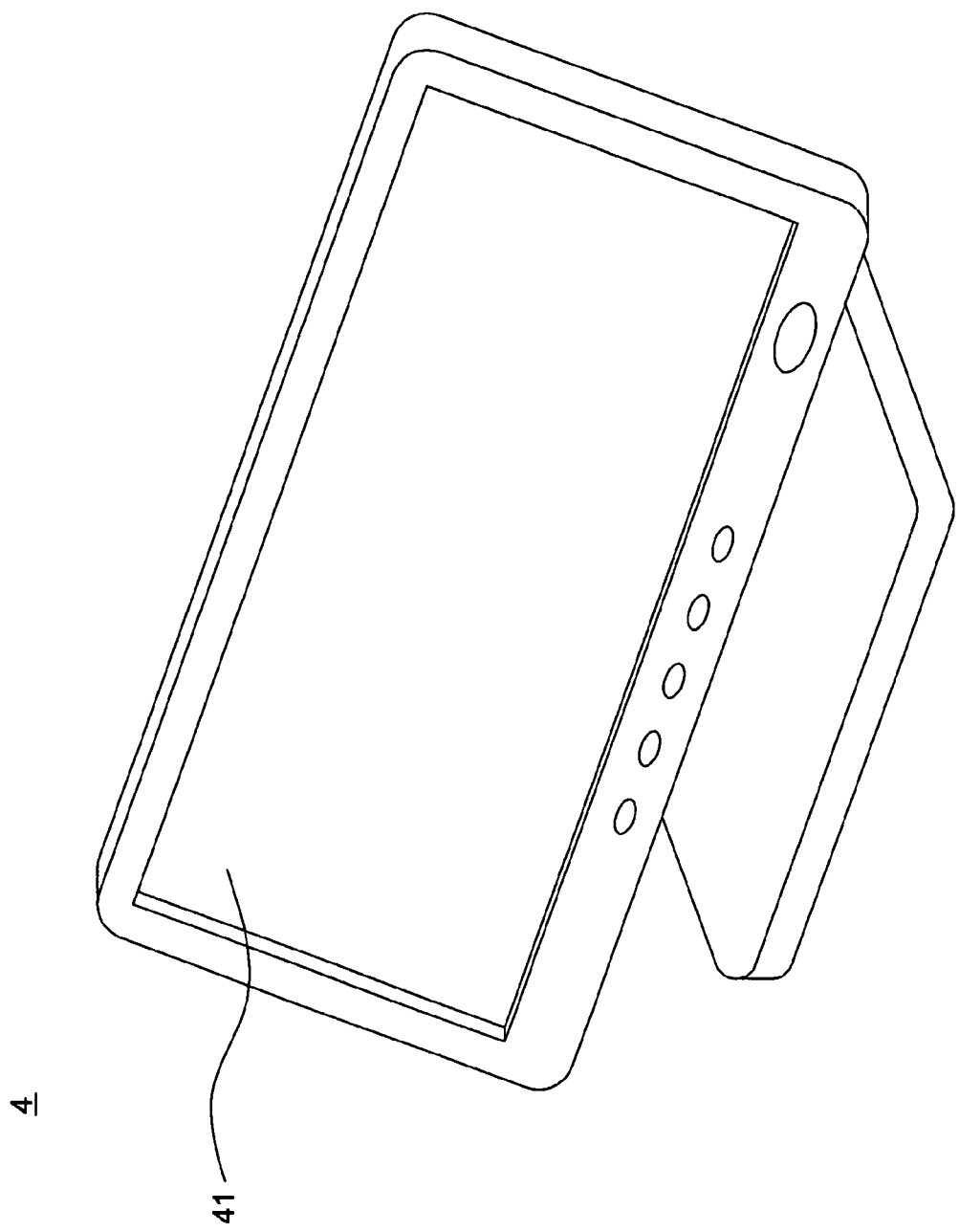
FIG. 4 is a schematic view that shows a display having LEDs according to a sixth preferred embodiment of the invention.

FIG. 4 is a schematic view that shows applications of the LED components or LED packaged structures in a display 4 according to a sixth preferred embodiment of the invention. The display 4 may be a LCD panel or a touch panel, and at least comprises a panel module 41, a driving circuit module (not shown), and a backlight module (please refer to FIGS. 2 and 3); the light sources of the backlight module comprise a plurality of LED components or LED packaged structures, and the LED components or LED packaged structures employed in this case have characteristics as described in any of the first to the fourth preferred embodiments mentioned above.

Figure 5:
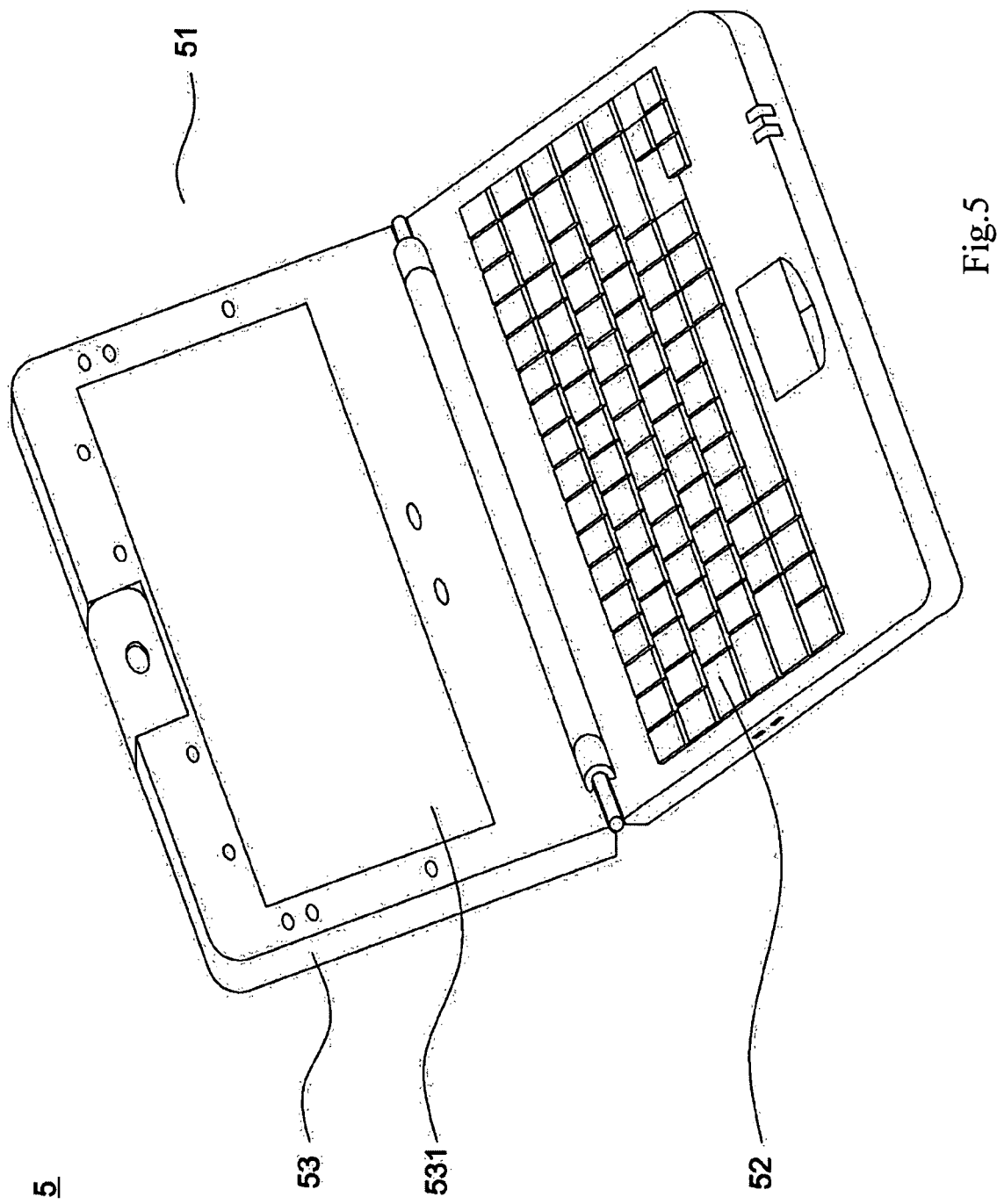
FIG. 5 is a schematic view that shows a portable computer having LEDs according to a seventh preferred embodiment of the invention.

FIG. 5 is a schematic view that shows applications of the LED components or LED packaged structures in a portable computer 5 according to a seventh preferred embodiment of the invention. The portable computer 5 at least comprises a main body 51, an input device 52, and a display 53. The display 53 is a LCD panel or a touch panel; the display 53 at least comprises a panel module 531, a driving circuit module (not shown), and a backlight module (please refer to FIGS. 2 and 3); the light sources of the backlight module comprise a plurality of LED components or LED packaged structures, and the LED components or LED packaged structures employed in this case have characteristics as described in any of the first to the fourth preferred embodiments mentioned above.

Figure 6:
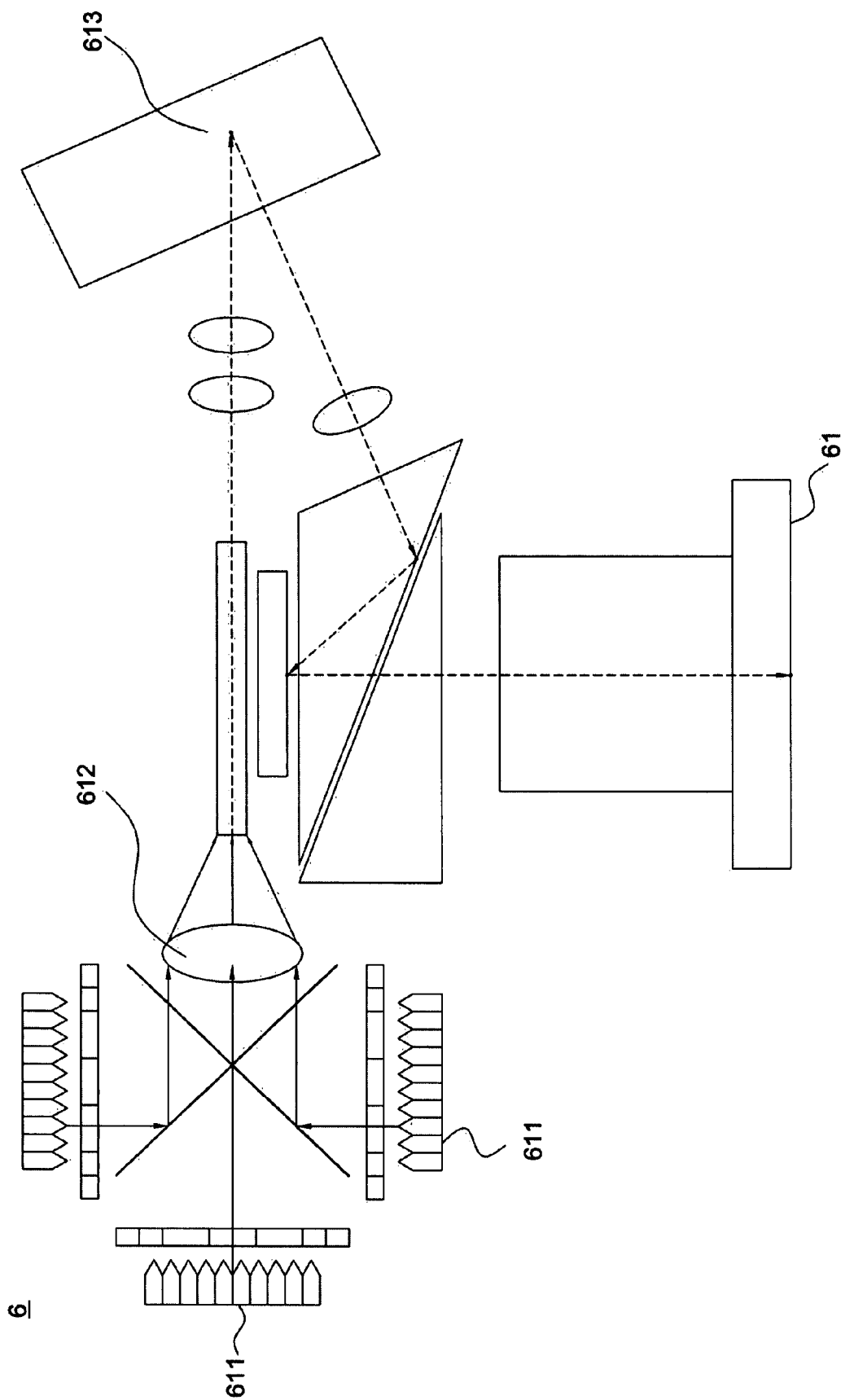
FIG. 6 is a schematic view that shows a projecting apparatus having LEDs according to an eighth preferred embodiment of the invention.

FIG. 6 is a schematic view that shows applications of the LED components or LED packaged structures in a projecting apparatus 6 according to an eighth preferred embodiment of the invention. The projecting apparatus 6 at least includes a housing, a driving circuit device and a camera module 61 disposed in the housing; the camera module 61 at least comprises a light source 611, a lens module 612, and an accompanying focus module 613; the light source 611 comprises a plurality of LED components or LED packaged structures, and the LED components or LED packaged structures employed in this case have characteristics as described in any of the first to the fourth preferred embodiments mentioned above.

Figure 7:
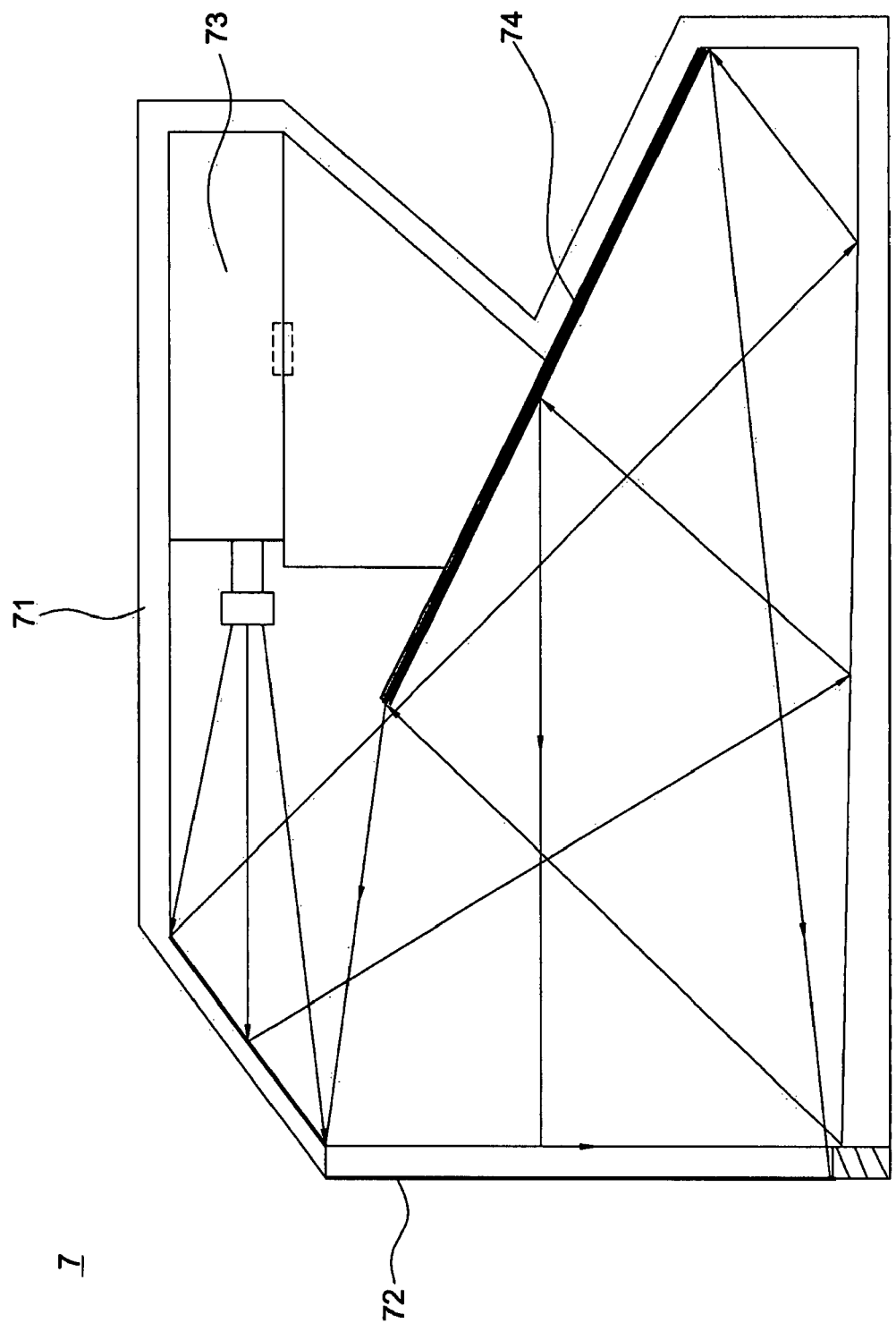
FIG. 7 is a schematic view that shows a rear projecting TV having LEDs according to a ninth preferred embodiment of the invention.

FIG. 7 shows applications of the LED components or LED packaged structures in a rear projecting TV 7 according to a ninth preferred embodiment of the invention. The rear projecting TV 7 at least includes a housing 71, a screen 72 disposed at a front end of the housing 71, a driving circuit module disposed in the housing 71, a projecting apparatus 73, and an optic reflective module 74 for reflecting images projected from the projecting apparatus 73 to the screen 72. The projecting apparatus 74 at least includes a light source, a lens module, and an accompanying focus module, which are related to each other as indicated in the sixth embodiment of FIG. 6. Wherein the light source comprises a plurality of LED components or LED packaged structures, and the LED components or LED packaged structures used in this case have characteristics as described in any of the first to the fourth preferred embodiments mentioned above.

Figure 8:
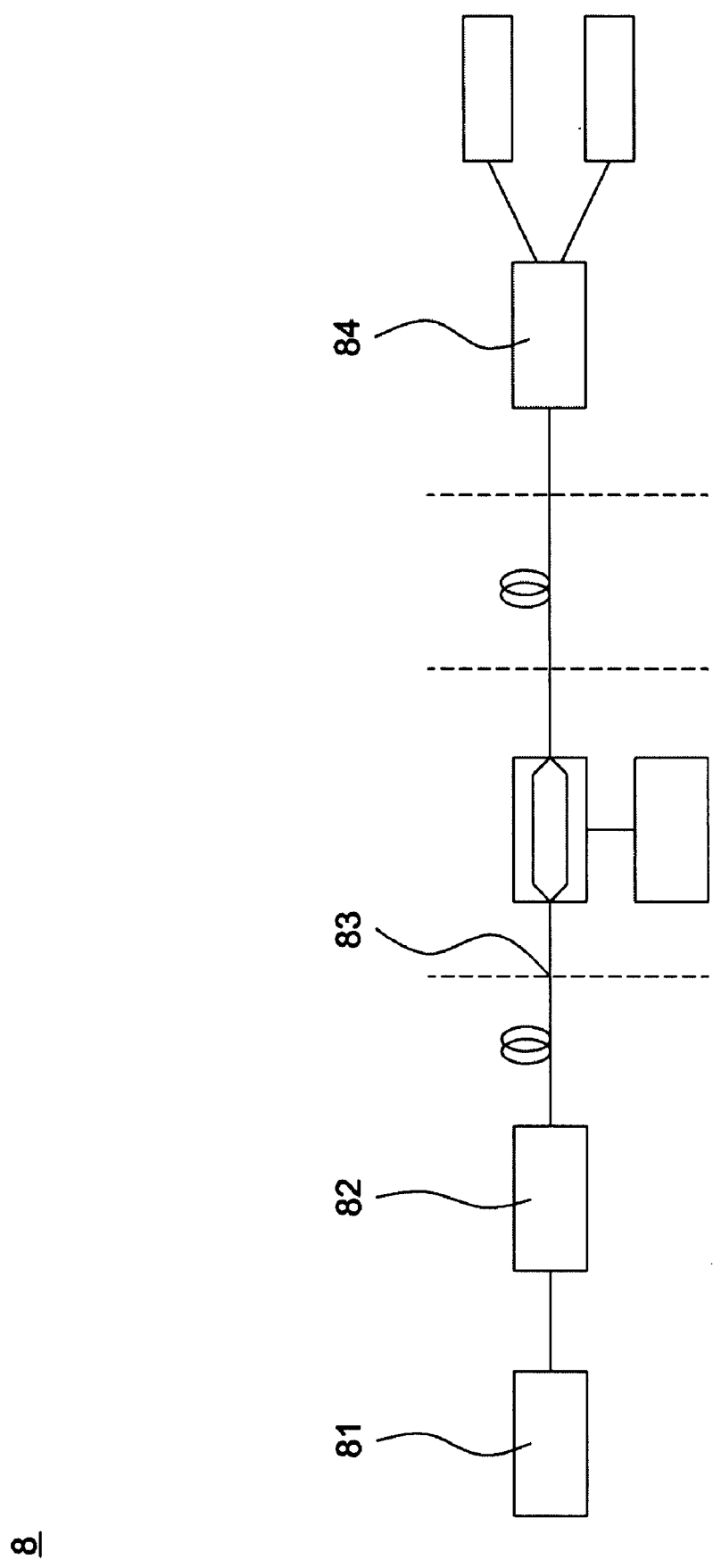
FIG. 8 is a schematic view that shows an optic communication system having LEDs according to a tenth preferred embodiment of the invention.

FIG. 8 shows applications of the LED components or LED packaged structures in an optic communication system 8 according to a tenth preferred embodiment of the invention. The optic communication system 8 at least comprises a light emitting module 81, a signal generation module 82, an optic fiber transmission network 83, and at least a light receiving module 84, which is characterized in that the light emitting module 81 comprises a plurality of LED components or LED packaged structures, and the LED components or LED packaged structures used here have characteristics as described in any of the first to the fourth preferred embodiments mentioned above.

Figure 9:
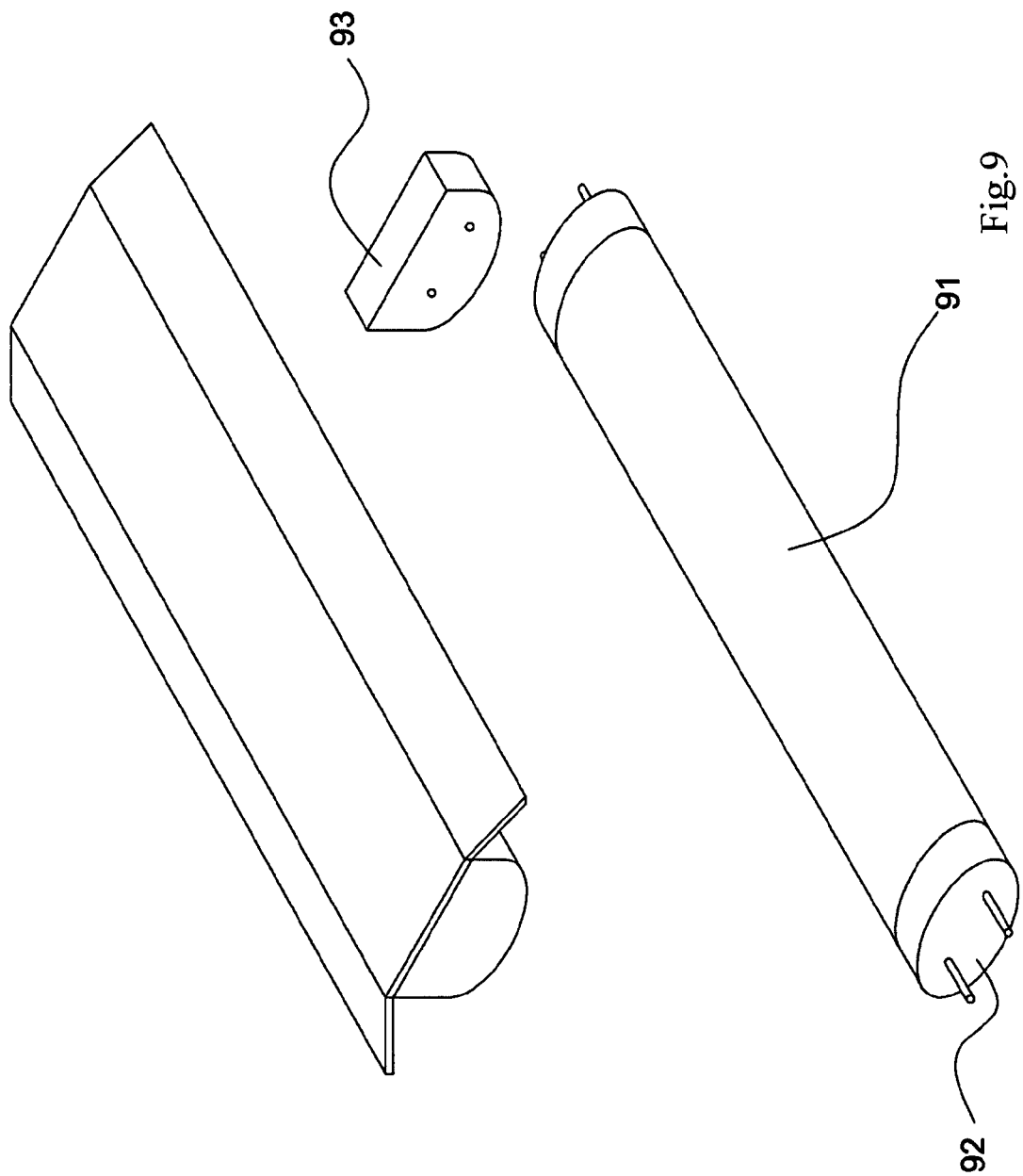
FIG. 9 is a schematic view that shows a light bulb having LEDs according to an eleventh preferred embodiment of the invention.

FIG. 9 shows applications of the LED components or LED packaged structures in a light bulb 9 according to an eleventh preferred embodiment of the invention. The light bulb 9 comprises a housing 91; a circuit board (not shown) disposed in the housing 91 and having a pair of electrodes and a plurality of LED components or LED packaged structures disposed thereon. The housing 91 has a connector 92 at an end thereof for being maneuvered and connected to an external socket 93, thus making the pair of electrodes of the circuit board conductive; the LED components or LED packaged structures used here have characteristics as described in any of the first to the fourth preferred embodiments mentioned above.

Figure 10B:
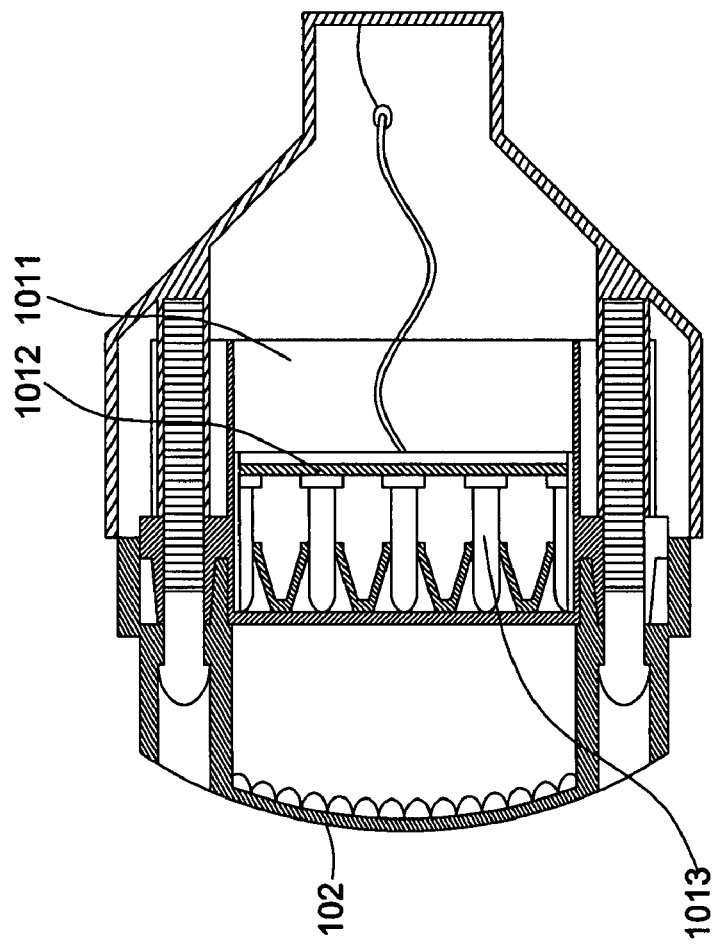
FIGS. 10A and 10B are schematic views that show a vehicular light having LEDs according to a twelfth preferred embodiment of the invention.
Figure 10A:
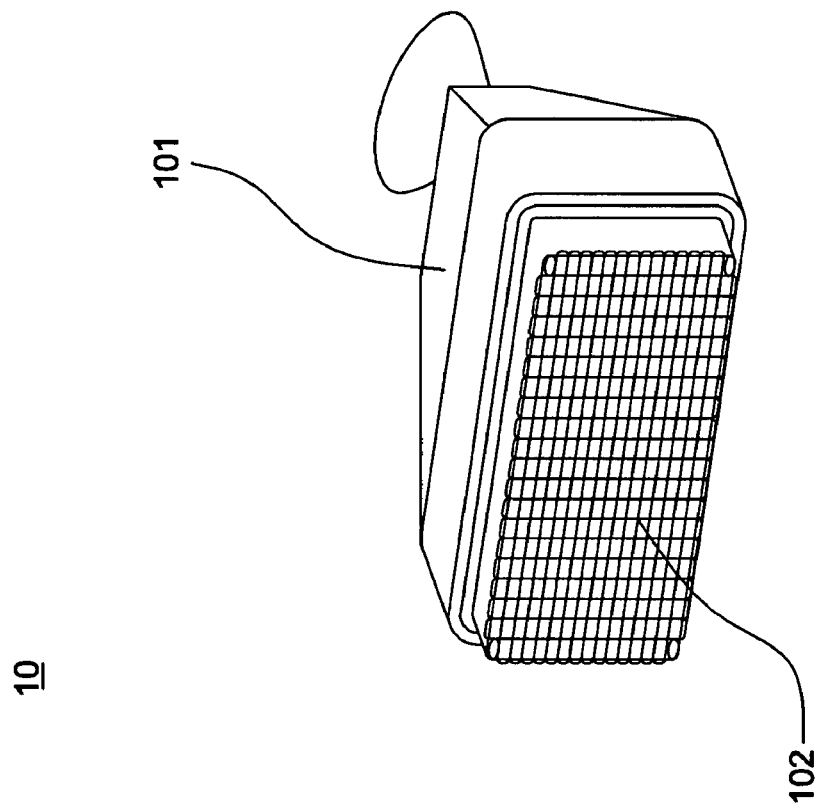

FIGS. 10A and 10B show applications of the LED components or LED packaged structures in a vehicular light 10 according to a twelfth preferred embodiment of the invention. The vehicular light 10 at least comprises a hollow housing 101 and a transparent lampshade 102 disposed at an open window of the housing 101, and the housing 101 includes therein a lamp holder 1011, a circuit board 1012, and a plurality of LED components or LED packaged structures 1013 disposed in the lamp holder 1011; the LED components or LED packaged structures used here have characteristics as described in any of the first to the fourth preferred embodiments mentioned above.

Figure 11:
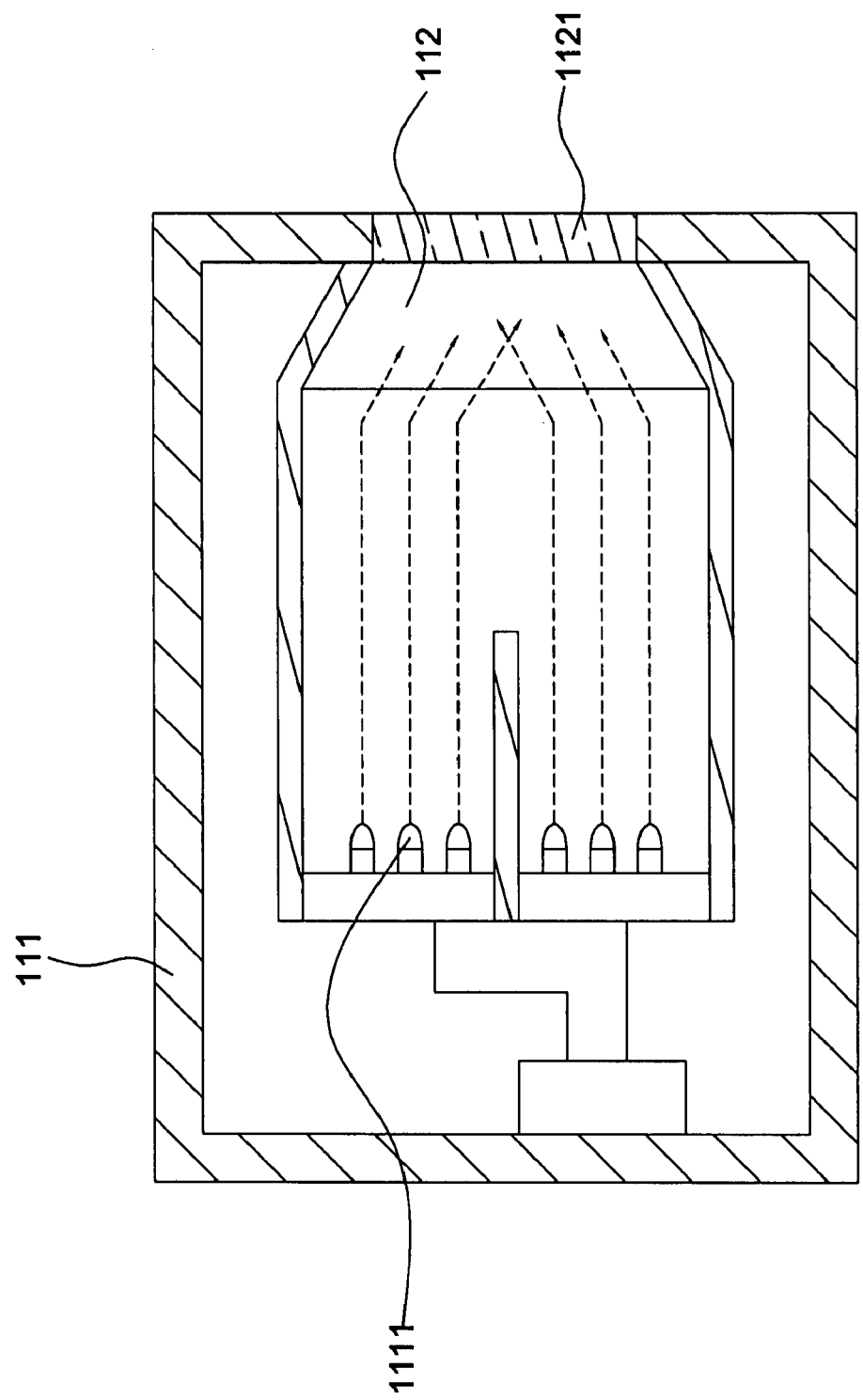
FIG. 11 is a schematic view that shows a traffic signal lamp having LEDs according to a thirteenth preferred embodiment of the invention.

FIG. 11 shows applications of the LED components or LED packaged structures in a traffic signal lamp 11 according to a thirteenth preferred embodiment of the invention. The traffic signal lamp 11 comprises a hollow housing 111 having an open window 112 at a side thereof, a transparent lampshade 1121 disposed at the open window 112, a light source 1111 disposed in the hollow housing 111 and including a plurality of LED components or LED packaged structures having different wavelengths of light, and a control loop (not shown) allocated in the housing 111 and connected to the light source 1111 for controlling a part or all of the LED components to emit mixed colors or a single color of light through the transparent lampshade 1121. The LED components or LED packaged structures used here have characteristics as described in any of the first to the fourth preferred embodiments mentioned above.

Figure 12B:
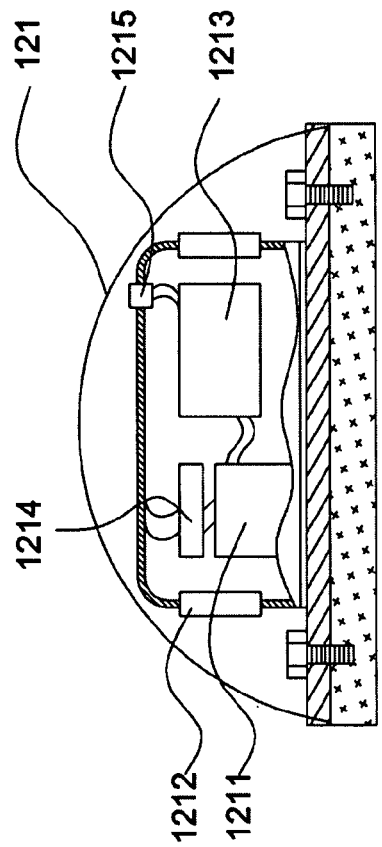
FIGS. 12A and 12B are schematic views that show a lane indicating lamp having LEDs according to a fourteenth preferred embodiment of the invention.
Figure 12A:
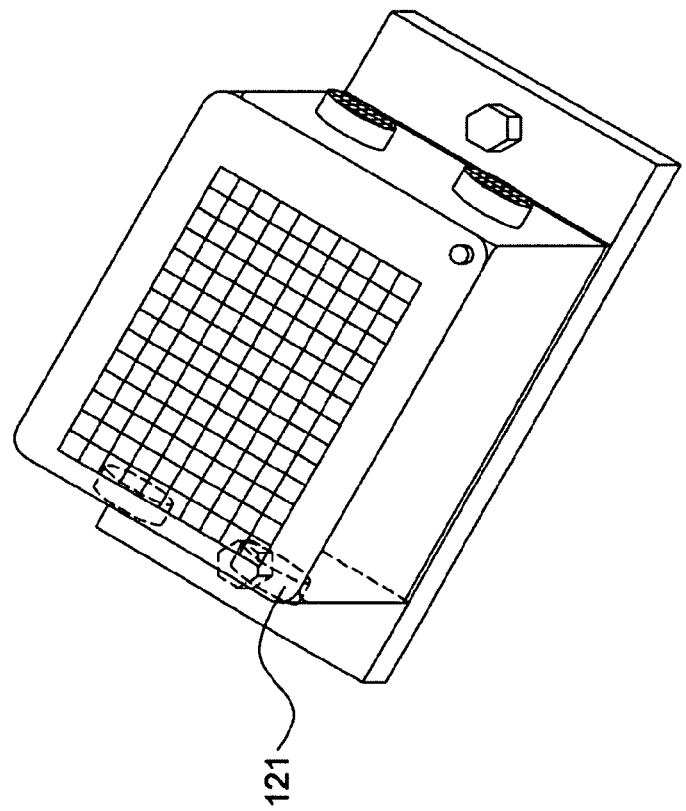

FIGS. 12A and 12B show applications of the LED components or LED packaged structures in a lane indicating lamp 12 according to a fourteenth preferred embodiment of the invention. The lane indicating lamp 12 includes a solar cell 1211, a charging circuit 1212, an accumulator 1213, an automatic lighting circuit 1214, and a light source 1215 collectively disposed in a transparent protective housing 121; wherein the solar cell 1211 faces upward in the transparent protective housing 121, which absorbs and converts solar energy into electrical energy, then charges the accumulator 1213 via the charging circuit 1212; the automatic lighting circuit 1214 connects the charging circuit 1212 with the light source 1215 in the housing 121 so as to allow the light source 1215 to emit light. The light source 1215 comprises a plurality of LED components or LED packaged structures, wherein the LED components or LED packaged structures used here have characteristics as described in any of the first to the fourth preferred embodiments mentioned above.

Figure 13:
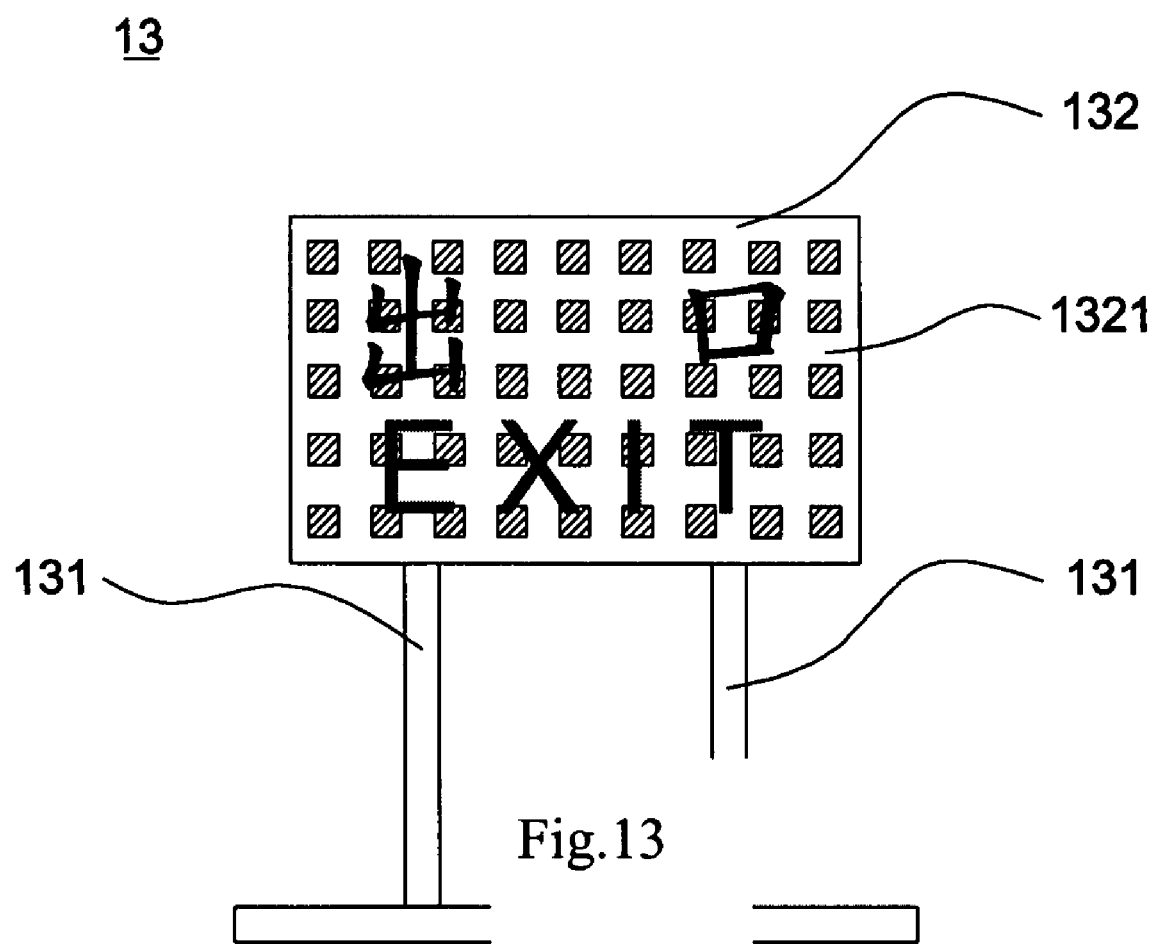
FIG. 13 is a schematic view that shows a traffic indicating apparatus having LEDs according to a fifteenth preferred embodiment of the invention.

FIG. 13 shows applications of the LED components or LED packaged structures in a traffic indicating apparatus 13 according to a fifteenth preferred embodiment of the invention. The traffic indicating apparatus 13 includes at least a support 131, and at least an indicating body 132 disposed on the support 131. Wherein the indicating body 132 comprises: a housing (not shown) made according to a predetermined size and having a transparent surface; a transparent panel 1321 disposed on the transparent surface of the housing and having predetermined characters or patterns disposed thereon; a light source (not shown) disposed in the housing and facing the transparent panel at a predetermined distance, and projecting light from inward to outward so as to illuminate the predetermined characters or patterns; and a power supply (not shown) for providing electrical power required by the light source; in which the LED components or LED packaged structures used here have characteristics as described in any of the first to the fourth preferred embodiments mentioned above.

A sixteenth preferred embodiment is further disclosed in the invention, which further implemented the LED components or LED packaged structures of the invention in digital electronic devices (not shown), and the digital electronic devices may be a photocopying machine, a scanner, a facsimile, an office multi-function printer, a LCD TV, an electronic billboard, a game console, a PDA, or a mobile communication device; characterized in that a display is present therein. The digital electronic device has a light source for providing light for the display, and the light source comprises a plurality of LED components or LED packaged structures, wherein the LED components or LED packaged structures used here have characteristics as described in any of the first to the fourth preferred embodiments mentioned above.

Although preferred embodiments of the invention has been described for purposes of illustration, it is understood that various changes and modifications to the described embodiment can be carried out without departing from the scope and the spirit of the invention as disclosed in the appended claims.

What is claimed is:

1. A LED packaged structure, comprising a frame, at least a LED component disposed on the frame, and a packaging resin enclosed around the LED component; characterized in that the LED component includes:
   a substrate;
   a first semiconductor conductive layer formed over the substrate;
   an active layer having a plurality of uneven multi-quantum wells formed over the first semiconductor conductive layer;
   a second semiconductor conductive layer formed over the active layer; and
   a transparent conductive layer formed over the second semiconductor conductive layer;
   wherein a plurality of particles formed by at least one hetero-material are scattered on the first semiconductor conductive layer directly so as to form the plurality of uneven multi-quantum wells.

2. The LED packaged structure according to claim 1, wherein each one of the uneven multi-quantum wells has a cross section with a ratio of width to height in a range between 3 to 1 and 1 to 10.

3. The LED packaged structure according to claim 1, wherein each one of uneven multi-quantum wells has a surface roughness Ra in a range between 0.5 and 50 nanometers.

4. The LED packaged structure according to claim 1, wherein each one of uneven multi-quantum wells has a surface roughness Ra in a range between 30 and 40 nanometers.

* * * * *